United States Patent [19]

Nam et al.

[11] Patent Number: 5,799,858
[45] Date of Patent: Sep. 1, 1998

[54] DIE BONDING DEVICE

[75] Inventors: Soo-keun Nam; Kook-hwan Kim, both of Yongin-gun, Rep. of Korea

[73] Assignee: Samsung Aerospace Industries, Ltd., Kyongsangnam-do, Rep. of Korea

[21] Appl. No.: 713,389

[22] Filed: Sep. 13, 1996

[30] Foreign Application Priority Data

Sep. 16, 1995 [KR] Rep. of Korea ............ 95-30325
Jul. 15, 1996 [KR] Rep. of Korea ............ 96-28611

[51] Int. Cl.⁶ ............................................. H01L 21/60
[52] U.S. Cl. .................... 228/6.2; 228/447; 228/49.5; 414/941; 29/742; 29/743
[58] Field of Search ................ 228/6.1, 6.2, 49.7, 228/49.5; 414/935, 941; 438/123; 29/742, 743

[56] References Cited

U.S. PATENT DOCUMENTS

| | | | |
|---|---|---|---|
| 4,010,885 | 3/1977 | Keizer et al. | 228/6.2 |
| 4,797,994 | 1/1989 | Michaud et al. | 29/740 |
| 4,878,610 | 11/1989 | Mori et al. | 228/6.2 |
| 4,935,803 | 6/1990 | Kalfus et al. | 257/673 |

*Primary Examiner*—Samuel M. Heinrich
*Attorney, Agent, or Firm*—Finnegan, Henderson, Farabow, Garrett & Dunner, L.L.P.

[57] ABSTRACT

A die bonding device is disclosed. The device includes a frame member, a first bonding head having controlled horizontal linear movement along the frame member, wafer supporting means for supporting a wafer from which semiconductor chips are formed, first semiconductor chip suction means installed in the first bonding head for picking up semiconductor chips from the wafer by vacuum suction, lead frame transferring means for transferring a lead frame to a semiconductor chip bonding position, a second bonding head having controlled horizontal linear movement along the frame member, a pre-alignment system for aligning a semiconductor chip from the first semiconductor chip suction means, and second semiconductor chip suction means installed in the second bonding head for picking up semiconductor chips aligned according to the pre-alignment system. The die bonding device is capable of performing direct bonding or indirect bonding as required and may include a collet exchanger.

11 Claims, 12 Drawing Sheets

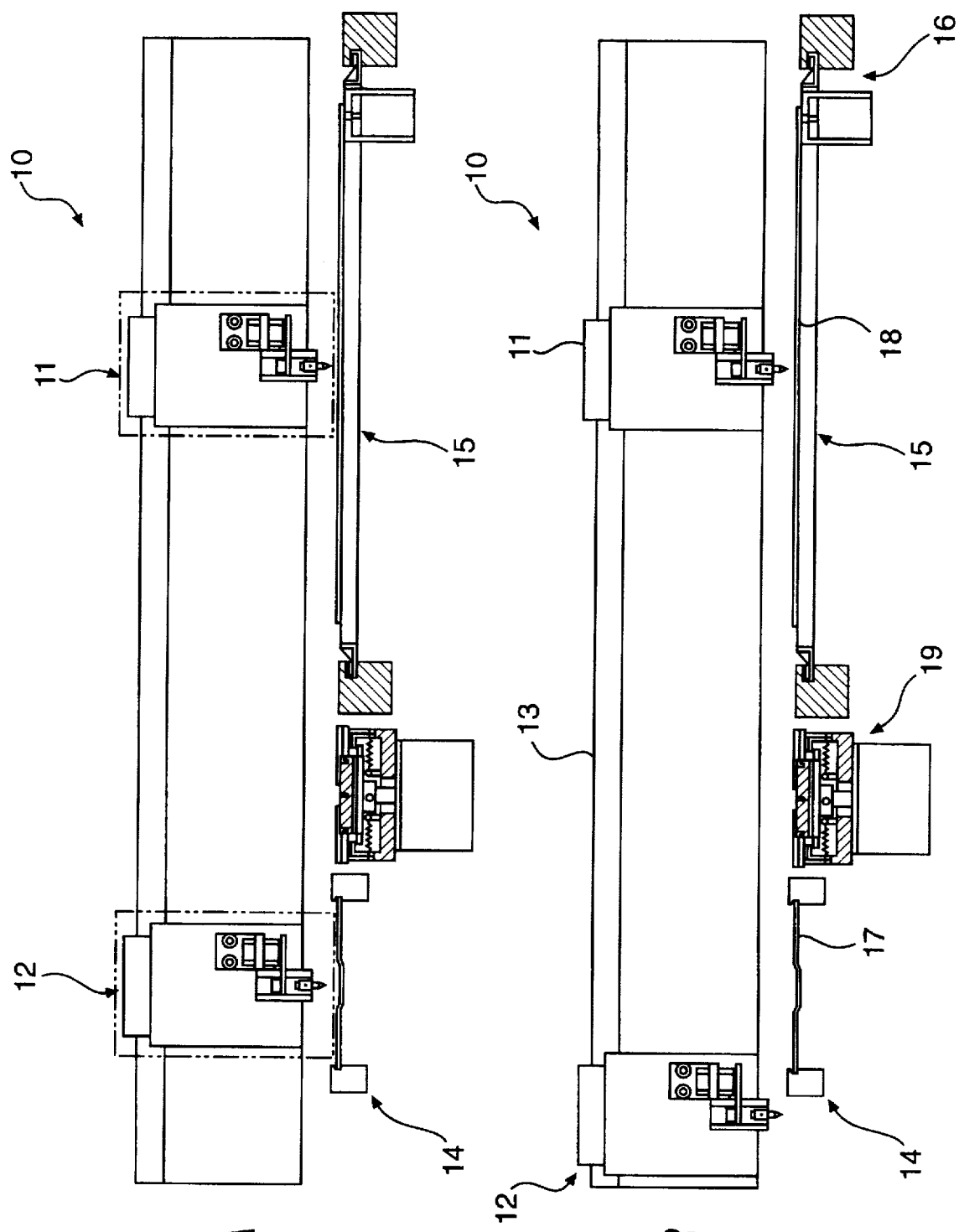

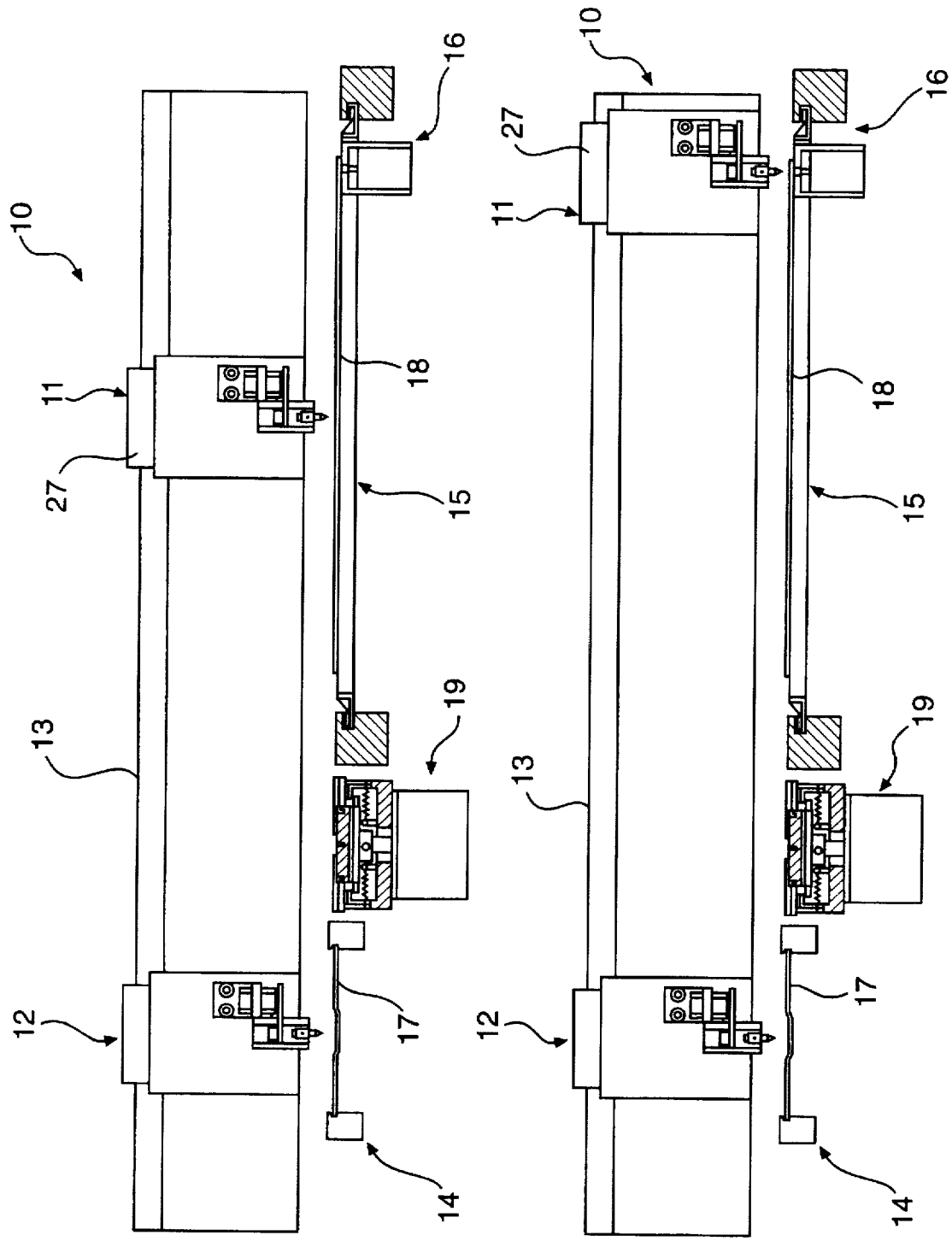

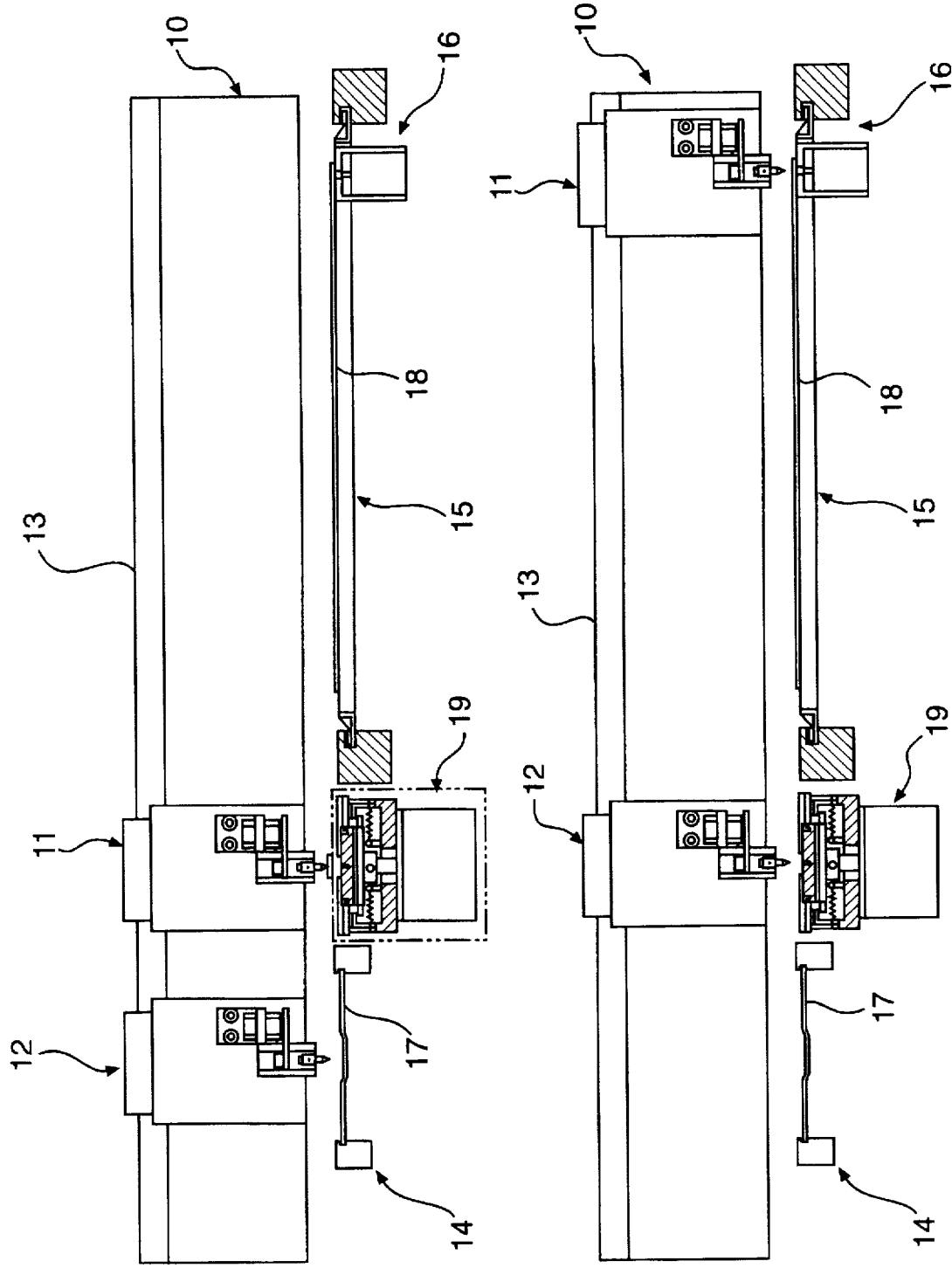

DIE BONDING DEVICE

BACKGROUND OF THE INVENTION

The present invention relates to a die bonding device for manufacturing a semiconductor device, and, more particularly, to a die bonding device for selectively performing direct bonding or indirect bonding. Also, the present invention relates to a die bonding device having a collet exchanger for automatically selecting a plurality of dovetail-shaped collets according to chip size.

A semiconductor chip (die) formed on a wafer is attached to lead frame by a bonding process. A die bonding device is for attaching the semiconductor chips to the lead frame. The lead frame serves as a means of transferring the functions of the semiconductor chip to an external circuit and supports the semiconductor chip. The bonding process can be either direct or indirect bonding operation depending on the whether a pre-alignment system is used.

As semiconductor devices become highly integrated, the size of the chip becomes larger. Also, the thickness of the chip is reduced to 0.25 mm with the use of GaAs wafers. Thus, the bonding process is required to be highly precise. In this instance, it is preferable to perform the indirect bonding operation, using a die bonding device in which a pre-alignment system is adopted.

In direct bonding, the semiconductor chip is detached from the wafer and attached directly to the lead frame without using the pre-alignment system. The speed of the die bonding device for direct bonding is greater than that of the bonding device for indirect bonding. Thus, production can be enhanced. Also, since the device is simple, the operation and maintenance of the device is easy since trouble with the device can be reduced. Since the control portion for changing the chip size is small, the device for direct bonding is suitable for various types of chips and for production of limited quantities.

The individual die bonding devices for direct bonding and indirect bonding have been used separately depending on operational necessity. In the case that both the direct bonding and indirect bonding are necessary due to various operating conditions, both devices must be provided, which increases cost and requires space for installation.

A means of transferring chips in order to attach chips in the form of the wafer to the lead frame or a printed circuit board is included in a general die bonding device. Since the size of the semiconductor chip is very small, the chip is held by a nozzle or collet by vacuum suction while being transferred. In the case that the chip is transferred by the collet, since the size of the semiconductor chip varies, the collet must be replaced depending on the size of the semiconductor chip.

Typically, collets are replaced manually by a skilled operator, using a special assembly tool, i.e., a jig, which requires much time, thereby reducing production efficiency.

SUMMARY OF THE INVENTION

Accordingly, it is an object of the present invention to provide a die bonding device for performing both direct bonding and indirect bonding. It is another object of the present invention to provide a die bonding device having a collet exchanger for automatically exchanging the collet according to semiconductor chip size.

To accomplish the above objects of the present invention, there is provided a die bonding device comprising a frame member, a first bonding head having controlled horizontal linear movement along the frame member, wafer supporting means for supporting a wafer from which semiconductor chips are formed, first semiconductor chip suction means installed in the first bonding head for picking up semiconductor chips from the wafer by vacuum suction, lead frame transferring means for transferring a lead frame to a semiconductor chip bonding position, a second bonding head having controlled horizontal linear movement along the frame member, a pre-alignment system for aligning a semiconductor chip from the first semiconductor chip suction means, and second semiconductor chip suction means installed in the second bonding head for picking up semiconductor chips aligned according to the pre-alignment system.

It is preferrable that the first and second semiconductor chip suction means are first and second collets exchangeably mounted on the first and second bonding heads, respectively, and the collets are raised and lowered by a voice coil motor. It is also preferrable that the first and second bonding heads are driven by a linear step motor during horizontal movement.

It is also preferrable that each position of the first and second bonding heads is detected during horizontal movement by linear encoders installed in each bonding head and a linear scale installed in the frame member. It is preferrable that the positions of each of the collets are detected by sensing plates and proximitor.

It is also preferable that the first bonding head controllably reciprocates between the wafer supporting means and the lead frame transferring means, such that the first semiconductor chip suction means detaches semiconductor chips from the wafer supported by the wafer supporting means and performs bonding of the semiconductor chip to the lead frame supported by the lead frame transferring means. Also, it is preferrable that the first bonding head controllably reciprocates between the wafer supporting means and the pre-alignment system, such that the first collet detaches semiconductor chips from the wafer supported by the wafer supporting means and aligns the chips in the pre-alignment system, and the second bonding head controllably reciprocates between the pre-alignment system and the lead frame transferring means, such that the second collet performs bonding of the semiconductor chips aligned in the pre-alignment system to the lead frame supported by the lead frame transferring means.

It is also preferrable that the first and second semiconductor chip suction means each comprise a first chuck having a dovetail-shaped groove and a hole, a first cylinder having a rod capable of controllably reciprocating in the dovetail-shaped groove through the hole of the first chuck, and a collet having a first dovetail-shaped protrusion corresponding to the groove of the first chuck on one side thereof and a second dovetail-shaped protrusion on another side thereof.

It is also preferable that the die bonding device further comprise a collet exchanger for exchanging the collet, the collet exchanger comprising a plurality of second chucks wherein both a dovetail groove corresponding to the second protrusion of the collet and a hole are formed in each second chuck; and a second cylinder having a rod for controllably reciprocating through the hole of the second chuck.

It is also preferable that the second chucks are arranged so as to be spaced radially at predetermined intervals on the collet exchanger, and further comprise means for controllably rotating the second chucks such that the rod of the second cylinder can reciprocate through the hole of one of the second chucks.

It is preferable that the die bonding device further comprises an elastic member installed in one end of each of the second chucks in order to support collets received in the second chucks.

BRIEF DESCRIPTION OF THE DRAWINGS

The above objects and advantages of the present invention will become more apparent by describing in detail a preferred embodiment thereof with reference to the attached drawings in which:

FIGS. 4A through 4C front are views illustrating components in different conditions during a direct bonding process utilizing the device of the present invention;

FIGS. 5A through 5E are front views further illustrating the indirect bonding process utilizing the device of the present invention;

DETAILED DESCRIPTION OF THE INVENTION

Figure 1:
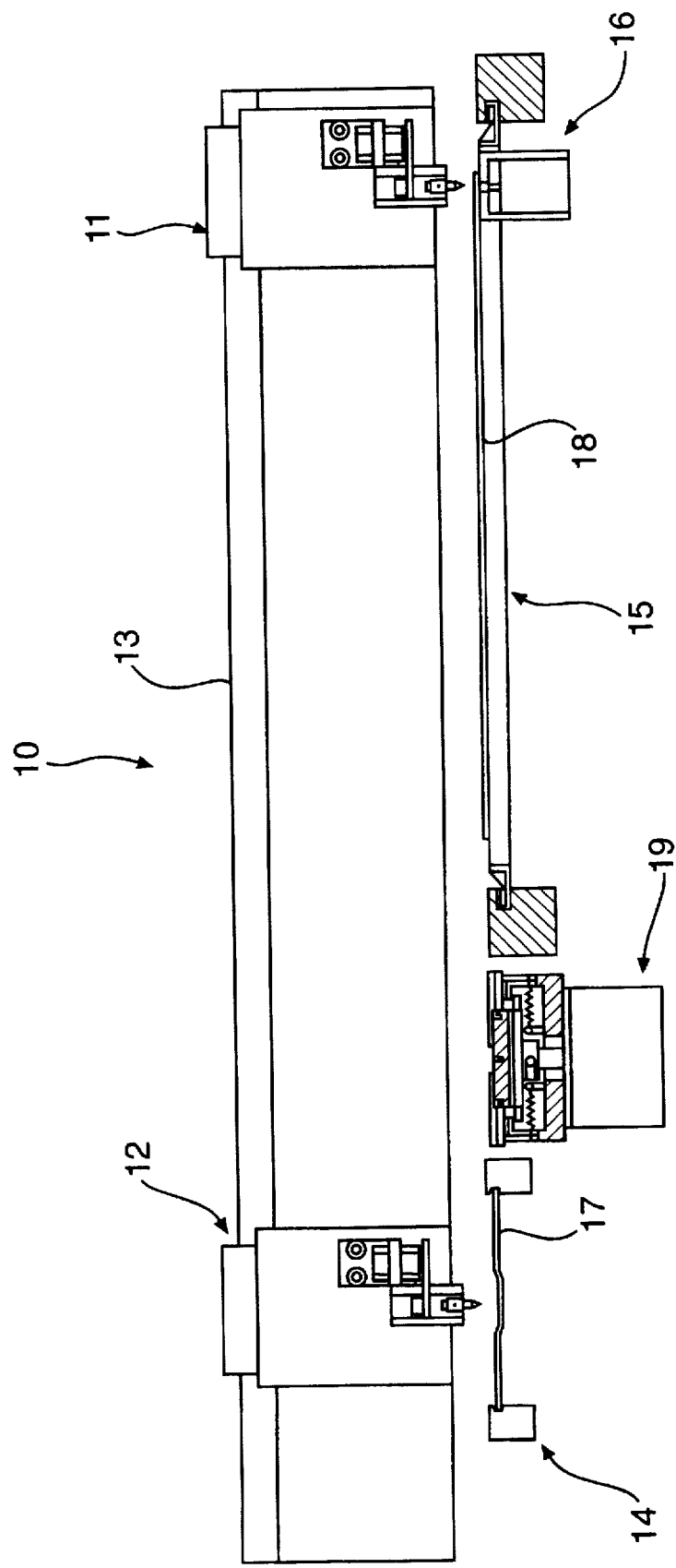
FIG. 1 is a front view of a die bonding device according to the present invention.

As shown in FIG. 1, a die bonding device 10 of the present invention includes first and second bonding heads 11 and 12, a lead frame transferring portion 14, a pre-alignment system 19, a wafer supporter 15 and a plunger 16. Also, a collet exchanger 80 (see FIG. 8) may be included, for example, near the pre-alignment system 19.

The bonding heads 11 and 12 are moved linearly and reciprocally on the frame member 13 by a motor (not shown). The lead frame transferring portion 14 sequentially supplies the lead frame 17 to a predetermined position. Each bonding head 11 and 12 can be moved horizontally on the wafer 18, the pre-alignment system 19 or the lead frame 17. The pre-alignment system 19 is used only for indirect bonding, and preferably is located between the lead frame transferring portion 14 and the wafer supporter 15 under the frame 13.

The wafer supporter 15 supports the wafer 18 on which semiconductor chips are formed. The wafer supporter 15 is capable of horizontally displacing the wafer 18 which is supported thereon. That is, in order for chips to be picked up with suction at a predetermined position by the bonding heads 11 and 12 which are controlled to be able to move in a horizontal direction, the wafer 18 is displaced horizontally.

Figure 2:
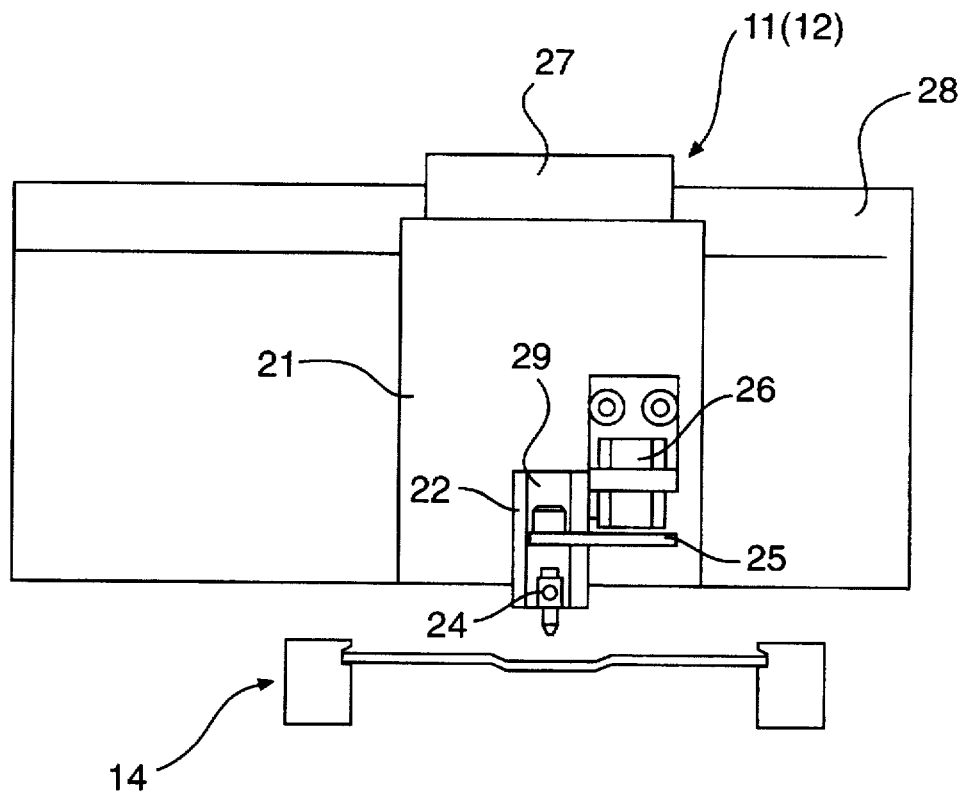
FIG. 2 is an enlarged fragmentary front view of a die bonding head of the device shown in FIG. 1.

FIG. 2 shows an enlarged view of a bonding head 11 (12) of the device shown in FIG. 1 positioned above the lead frame transferring portion 14. The bonding head 11 (12) includes an inductor 21 for reciprocating horizontal motion from the operation of the linear motor. The horizontal position of the bonding head 11 (12) can be detected by a linear encoder 27. A collet 24 exchangeably mounted on each bonding head 11 (12) detaches semiconductor chips from the wafer 18 of FIG. 1 and mounts the detached chips on the lead frame 17 (see FIG. 1). The collet 24 picks up the semiconductor chips by vacuum suction. In another embodiment, a vacuum nozzle can be substituted for the collet 24. The collet 24 can be moved vertically by driving a voice coil motor (VCM) 29. The VCM 29 is supported by a holder 22. The vertical movement of the collet 24 can be detected and controlled by a sensing plate 25 and a proximitor 26.

Figure 3:
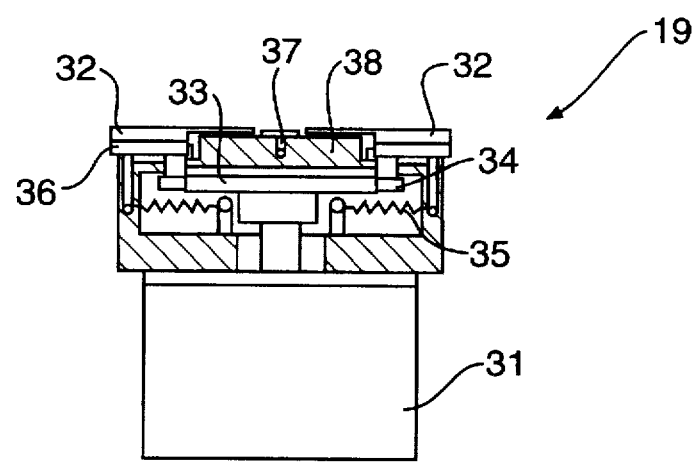
FIG. 3 is an enlarged front view of a pre-alignment system of the device shown in FIG. 1.

FIG. 3 is an enlarged view of the pre-alignment system 19 of FIG. 1. The pre-alignment system 19 is for aligning the position of a semiconductor chip on a surface of an aligning portion 38. A blade 32 of the pre-alignment system 19 functions to determine the position of the semiconductor chip. In the case of indirect bonding using the pre-alignment system 19, a first bonding head 11 detaches a semiconductor chip from the wafer 18 and aligns the detached semiconductor chip on the surface of the aligning portion 38 of the pre-alignment system 19, and a second bonding head 12 picks up the semiconductor chip aligned on the surface of the aligning portion 38 and attaches the semiconductor chip to a lead frame 17.

A vacuum hole 37 is formed in the surface of the aligning portion 38, and thus the chip can be held on the aligning portion 38 by vacuum produced in the vacuum hole 37. A motor 31 drives a cam 33, and operation of the cam is transmitted to the blade 32 through a cam follower 34. The blade 32 aligns the chip held on the surface of the aligning portion 38 at a predetermined position. After the pre-alignment, the bonding head 12 (FIG. 1) picks up the chip and bonds the chip to the lead frame 17.

The operation of the die bonding device will be described below. The die bonding device can perform both direct bonding and indirect bonding.

FIG. 4A shows an initial position of the bonding heads 11 and 12 in direct bonding. Here, the second bonding head 12 is positioned at the middle of the lead frame transferring portion 14, and the first bonding head 11 is located in the middle of the wafer supporter 15. When a direct bonding mode is selected, only the first bonding head 11 is used. Accordingly, the second bonding head 12 is moved to a standby position.

Figure 4C:
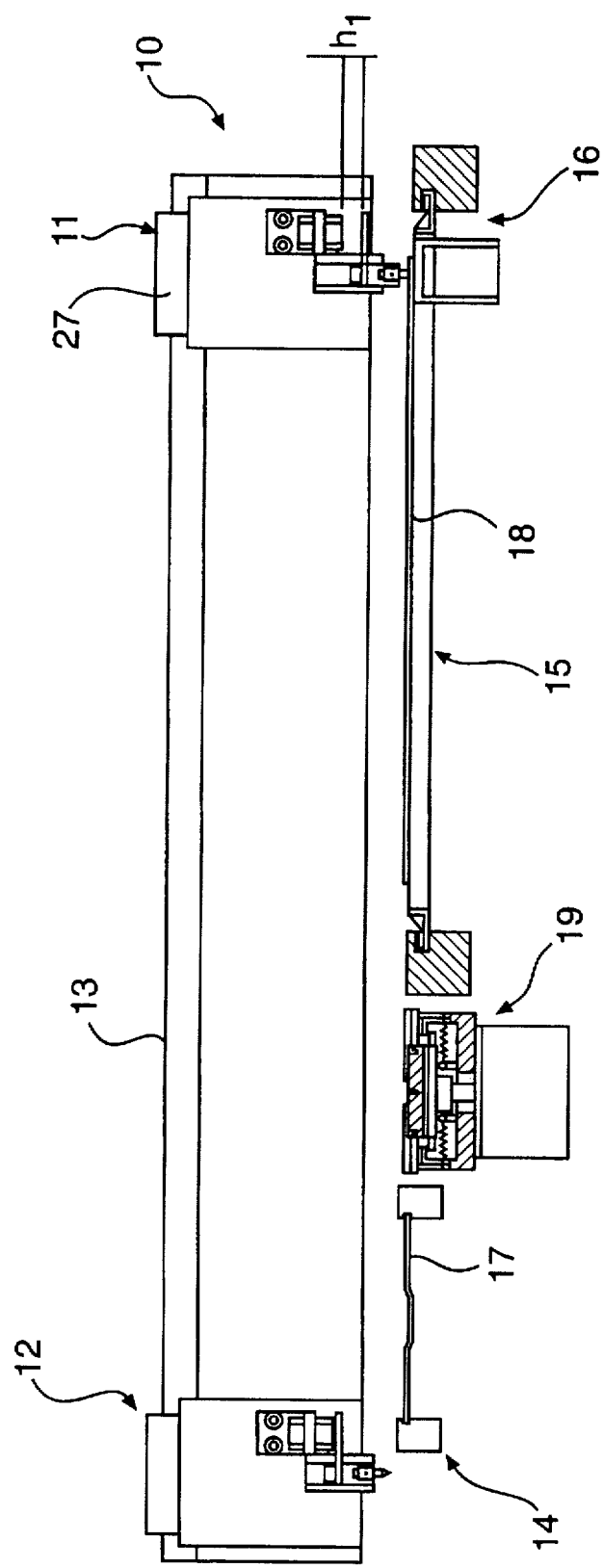

FIG. 4B shows the position of the second bonding head 12 moved to the standby position. The second bonding head 12 is positioned at the farthest point to the left of the frame 13, and the first bonding head 11 moves to a pick-up position above a chip. The pick-up position of the chip, which can be arbitrarily determined, is at the farthest point to the right of the frame 13 in the condition shown in FIG. 4C. The horizontal movement and positioning of the bonding heads 11 and 12 is controlled by linear encoders 27 installed in each bonding head 11 and 12. When the first bonding head 11 is located at the farthest point to the right, the collet 24 is lowered according to the operation of the voice coil motor 29 (FIG. 2). The collet 24 detaches and picks up a semiconductor chip from the wafer 18 by vacuum suction. Here, the distance hi by which the collet 24 is lowered is controlled by the proximitor 26 (FIG. 2) and a sensing plate 25. The semiconductor chips are detached while a needle (not shown) rises from a plunger 16.

The semiconductor chip is picked up by the collet 24 which is in turn lifted by the voice coil motor 29, and then moved to the lead frame 17 supported by the lead frame transferring portion 14 according to the horizontal movement of the first bonding head 11. Next, the collet 24 is lowered and the chip is released by the removal of the vacuum state, allowing alignment of the chip at a predetermined position on the lead frame 17 and bonding.

After the semiconductor chip is detached from the wafer 18 and moved, it is preferable that the wafer supporter 15 be step-moved in order to detach and move a subsequent semiconductor chip. That is, the wafer supporter 15 moves by a step so that the first bonding head 12 can pick up the semiconductor chip from the wafer 18 at constant position. Thus, the next semiconductor chip can be placed at the pick-up position.

FIGS. 5A through 5E show the consecutive steps of the indirect bonding process.

As shown in FIG. 5A, in the initial state of the die bonding device, the second bonding head 12 is located above the lead frame transferring portion 14, and the first bonding head 11 is located above the wafer supporter 15. When an indirect bonding mode is selected, the second bonding head 12 remains stationary and the first bonding head 11 moves to the predetermined chip pick-up position at the farthest point to the right of the frame member, as shown in FIG. 5B. Here, the collet 24 of the first bonding head 11 is lowered to pick up a chip by vacuum suction, and then after pickup the collet is raised again.

Next, the first bonding head 11 moves to a position above the pre-alignment system 19 (see FIG. SC). The chip picked up by the collet 24 is aligned on the aligning portion 38 of the pre-alignment system 19, and the chip is aligned by the blade 32.

FIG. 5D shows the position of bonding heads 11 and 12 after the chip has been aligned by the pre-alignment system 19. The first bonding head 11 moves to a position above the chip pick-up position from the pre-alignment system 19 and the second bonding head moves to a position above the pre-alignment system 19. Next, each collet 24 installed in each bonding head 11 and 12 is lowered. The collet 24 of the second bonding head 12 picks up the chip from the pre-alignment system 19, and then is raised; and the collet 24 of the first bonding head 11 detaches and picks up the chip from the wafer 18, and then is raised.

Figure 5E:
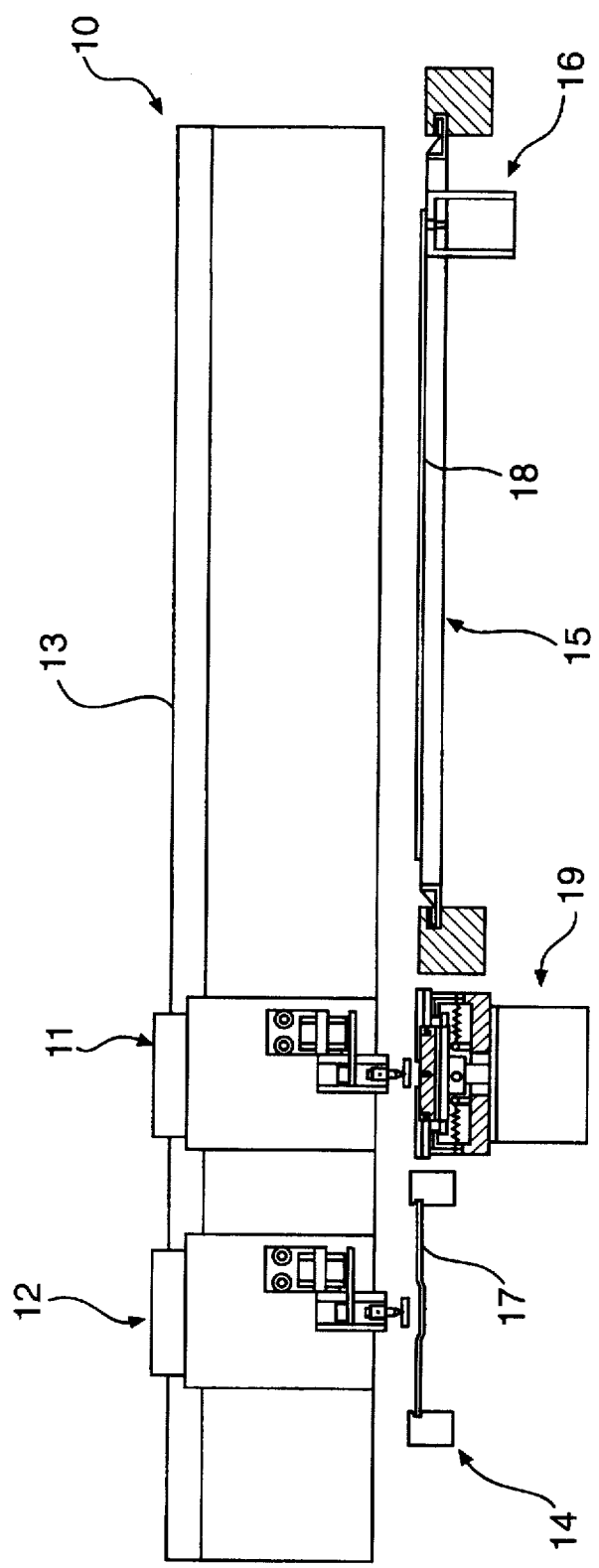

FIG. 5E shows the second bonding head 12 moving a chip to a position above the lead frame 17 from the pre-alignment system 19, and the first bonding head 11 moving a chip to the pre-alignment system 19 from the wafer 18. Then, collets 24 installed in each bonding head 11 and 12 are lowered and the chips are detached from the collets 24. That is, while the bonding head 12 in the lead frame 17 performs bonding, the other bonding head 11 places the chip on the pre-alignment system 19. Then, the operations as described above are repeated.

Figure 6:
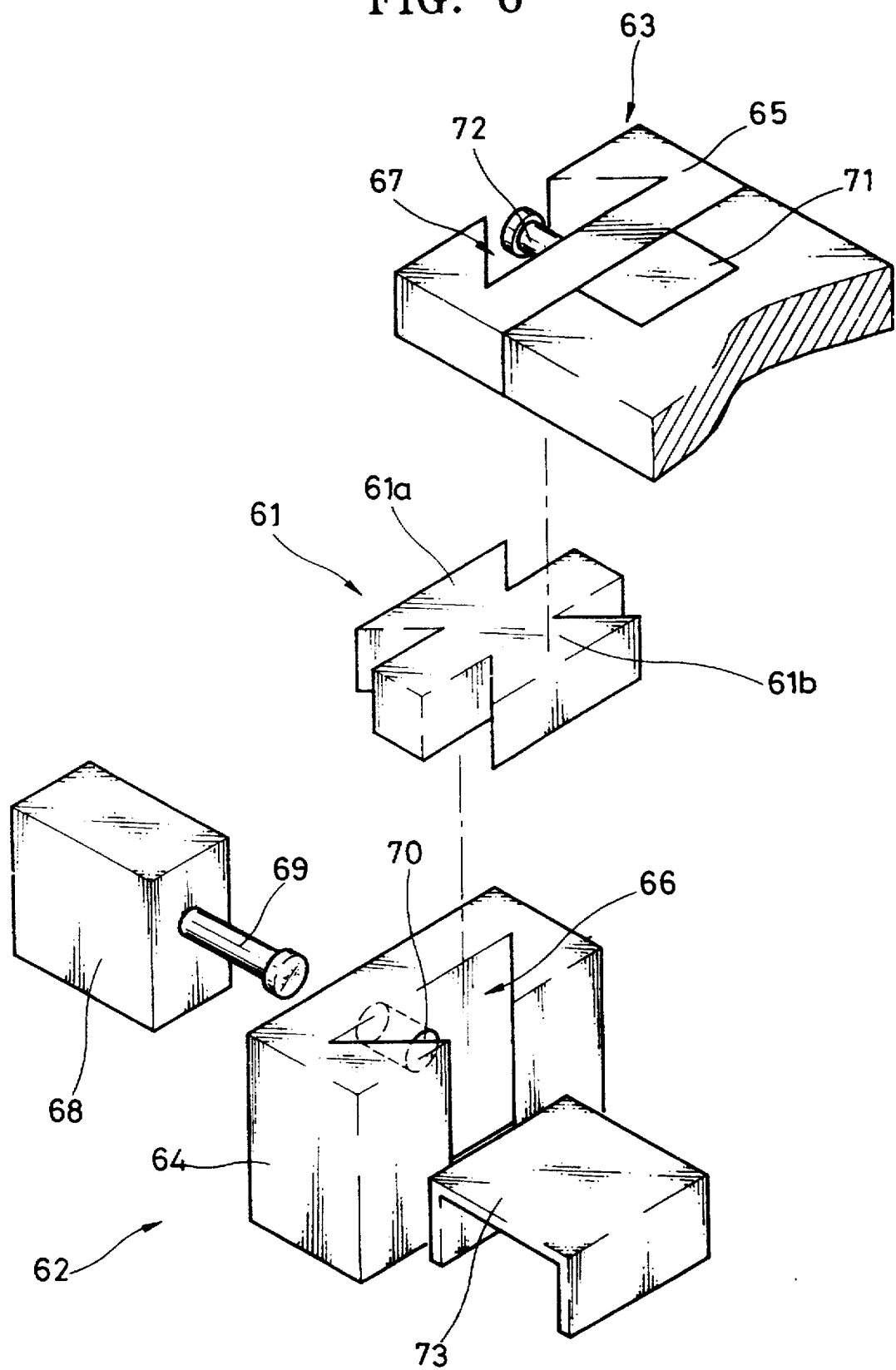
FIG. 6 is an exploded perspective view illustrating the construction of a collet exchanger of the present invention.

FIG. 6 illustrates a collet exchanger which is selectively adopted by the die bonding device of the present invention. Protrusions 61a and 61b shaped in the form of a dovetail are located on either side of a collet 61. The collet 61 is exchanged between an exchanger 62 and a bonding head arm 63. The exchanger 62 includes a chuck 64 where a groove 66 is formed which corresponds to one dovetail-shaped protrusion 61a of the collet 61. In FIG. 6, only one chuck 64 is shown, however, in practice, a plurality of chucks 64 are included in the exchanger 62 (see FIG. 8). The bonding head arm 63 includes a bonding head chuck 65 where a groove 67 is formed corresponding to the other dovetail-shaped protrusion 61b of the collet 61.

One side of the chuck 64 includes a cylinder 68. A rod 69 of the cylinder 68 can be inserted through a hole 70 formed in the chuck 64. The other side of the chuck 64 includes a leaf spring 73 in order to safely put a collet 61 thereon. When the protrusion 61a descends toward the groove 66 from the vertical upper portion of the chuck 64, the collet 61 is capable of inserting into the groove 66 of the chuck 64. After complete insertion, the collet 61 is supported on the upper portion of the leaf spring 73, and the rod 69 of the cylinder 68 passes through the hole 70, to thereby press the protrusion 61a to fit within the groove 66.

A bonding head chuck 65 is attached to an end of the bonding head arm 63. On one side of the bonding head chuck 65, a cylinder 71 is installed, and a cylinder rod 72 passes through a hole (not shown) formed on the bonding head chuck 65 and moves back and forth toward the groove 67.

The bonding head arm 63 can be controlled to move vertically by driving means (not shown). Accordingly, when the bonding head arm 63 is lowered with the rod 72 of the cylinder 71 moved backward, the protrusion 61b of the collet 61 inserts into the groove 67. Then, when the cylinder rod 72 moves forward, the collet 61 is pressed to fit into the groove 67.

Figure 7:
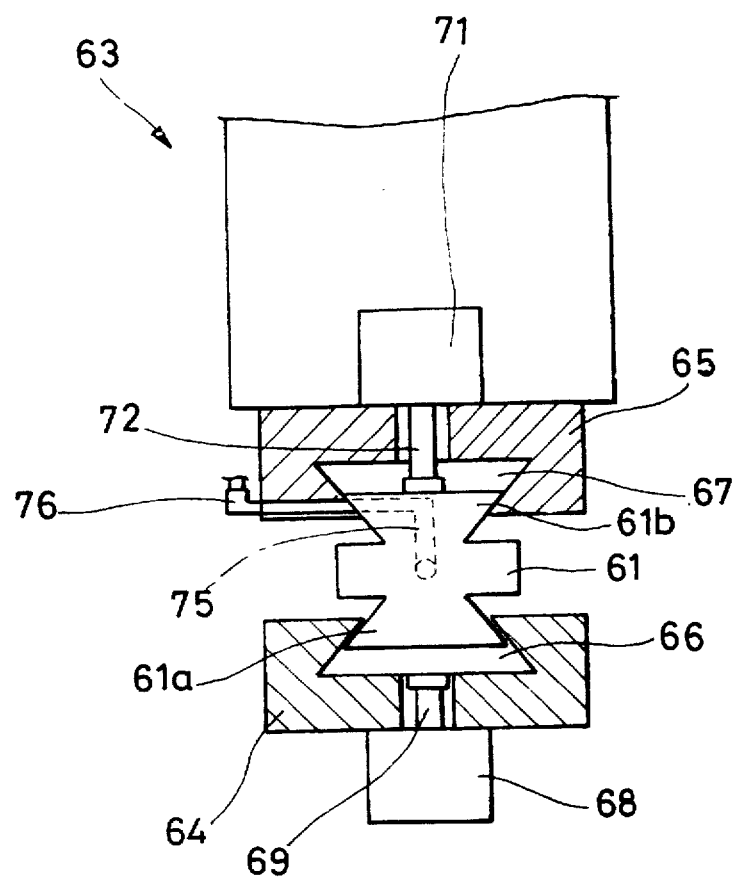
FIG. 7 is a plan view illustrating the construction of the collet exchanger of FIG. 6.

As shown in FIG. 7, both the groove 66 of the exchanger chuck 64 and the groove 67 of the bonding head chuck 65 are larger than protrusions 61a and 61b of the collet 61. Also, as the cylinder rods 69 and 72 move toward the grooves 66 and 67, the collet 61 fits into each groove 66 and 67, and as the cylinder rods 69 and 72 move backward from the grooves 66 and 67, the collet 61 deviates from the grooves 66 and 67. Reference numeral 75 designates a vacuum line of the collet 61, which is connected to a vacuum line 76 formed on the bonding head chuck 65 when the collet 61 is fixed to the bonding head chuck 65. The vacuum line 75 of the collet 61 is used when the collet 61 picks up the semiconductor chips by vacuum suction.

Figure 8:
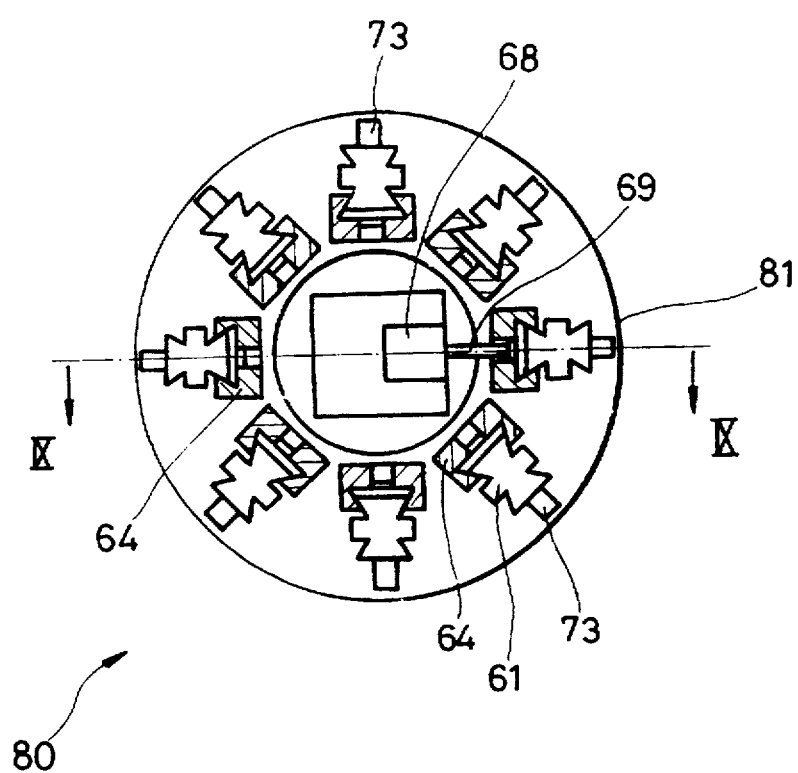
FIG. 8 is a plan view of the collet exchanger of the present invention.

As shown in FIG. 8, the collet exchanger 80 includes a plurality of exchanger chucks 64 and leaf springs 73 installed radially on a circular rotary step motor 81. In the present embodiment, the exchanger chucks 64 and the leaf springs 73 are arranged such that they are spaced from one another by an interval of 45 degrees. Also, the cylinder 68 is provided at the center. The collet 61 is inserted into the exchanger chuck 64.

Figure 9:
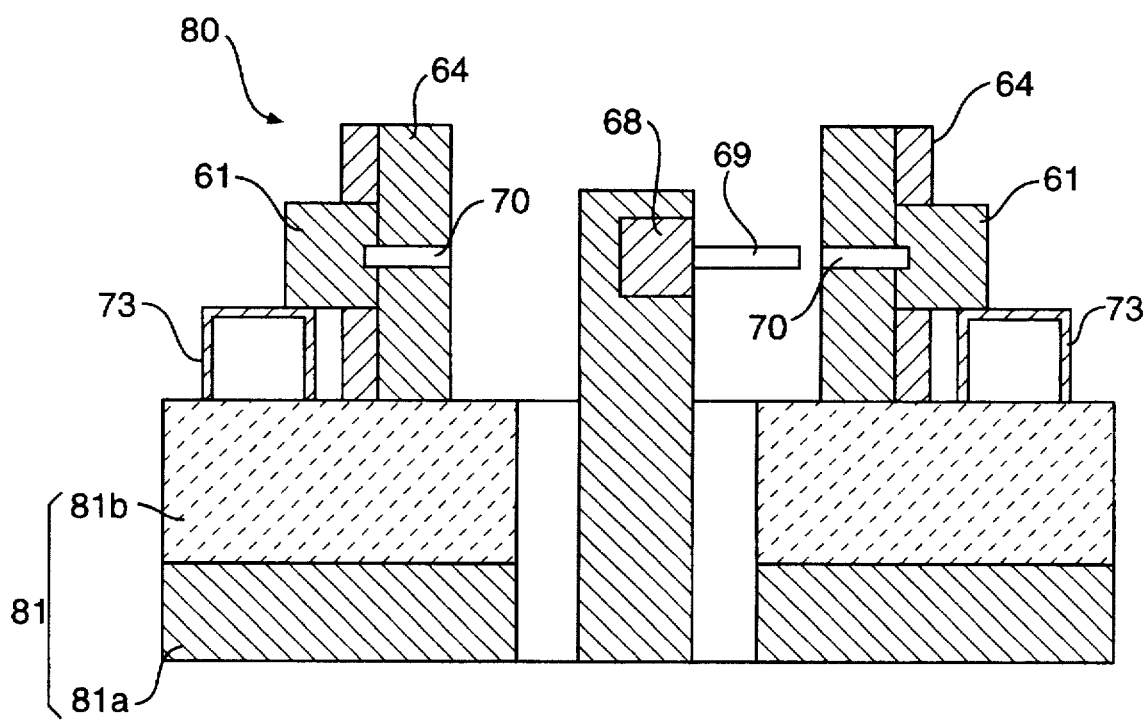
FIG. 9 is a schematic sectional diagram of the collet exchanger taken along line IX—IX of FIG. 8.

As shown in FIG. 9, the rotary step motor 81 has a lower stator 81a and an upper inductor 81b. While the stator 81a is fixed, the inductor 81b rotates with control on the stator 81a. The exchanger chucks 64 and the leaf springs 73 are arranged on the inductor 81b, which is rotated by the rotation of the inductor 81b. The cylinder 68 is fixed. The rotary step motor 81 rotates each exchanger chuck 64 to be located in a position where the cylinder rod 69 can move forward or backward through the hole 70 formed in the exchanger chuck 64. For example, a rotary actuator, instead of the rotary step motor 81, can drive the exchanger chuck 64.

The operation of the collet exchanger used in the die bonding device according to the present invention will now be described in detail.

As shown in FIGS. 8 and 9, the collets 61 differ in size to correspond to varying chip sizes and are connected to the exchanger chucks 64 arranged radially at regular intervals around the circumference of the inductor 82b. In FIGS. 6 and 7, the protrusion 61a at one side of the collet 61 does not fit tightly into the groove 66 of the chuck 64, and the bottom thereof is supported by the leaf spring 73.

In order to fix a particular collet 61 shown in FIG. 6 to the bonding head chuck 65 by the bonding head arm 63, the inductor 81b rotates in order to locate a particular chuck 64 at the front of the cylinder 68, where the particular collet 61 is maintained. Next, the rod 69 of the cylinder 68 moves forward through the hole 70 formed on the chuck 64, thereby to press the protrusion 61a of the collet 61 to the groove 66 and locate the collet 61 at a constant position. The collet 61 fitting the exchanger chuck 64 is located in order that the groove 67 of the bonding head chuck 65 can be inserted into the other protrusion 61b of the collet 61, when the bonding head arm 63 is vertically lowered.

The bonding head arm 63 for lifting the collet 61 is lowered while the rod 72 of the cylinder 71 remains stationary. When the bonding head arm 63 is lowered and the protrusion 61b of the collet 61 is inserted into the groove 67 of the bonding head chuck 65, the cylinder rod 72 moves forward, thereby to press the protrusion 61b of the collet 61 to the groove 67 of the bonding head chuck 65. Next, when the cylinder rod 69 of the exchanger 62 moves backward, the protrusion 61a of the collet 61 is released from the exchanger chuck 64. When the bonding head arm 63 is raised, the exchange of the collets 61 is complete.

In the case that the collet 61 fixed to the bonding head chuck 65 is used, the exchange of the collets 61 can be performed by a method similar to the above-mentioned method. In order to move the chuck 64 without the collet 61 to the front side of the cylinder 68, the inductor 81b of FIG. 8 rotates. Next, the bonding head arm 63 is lowered, thereby to insert the protrusion 61a of the collet 61 fixed thereto into the groove 66 of the chuck 64. When the cylinder rod 69 of the exchanger moves forward, the collet 61 is pressed and fitted to the groove 66, and when the cylinder rod 72 of the backward and the 63 moves backward and the bonding head arm 63 is raised, the collet 61 is released from the bonding head arm 63. Then, when the inductor 81b rotates in order to locate the chuck 64 combined with the other collet 61 on the front side of the cylinder 68 of the exchanger 62, the collet can be exchanged according to the above-mentioned operation sequence.

Figure 10:
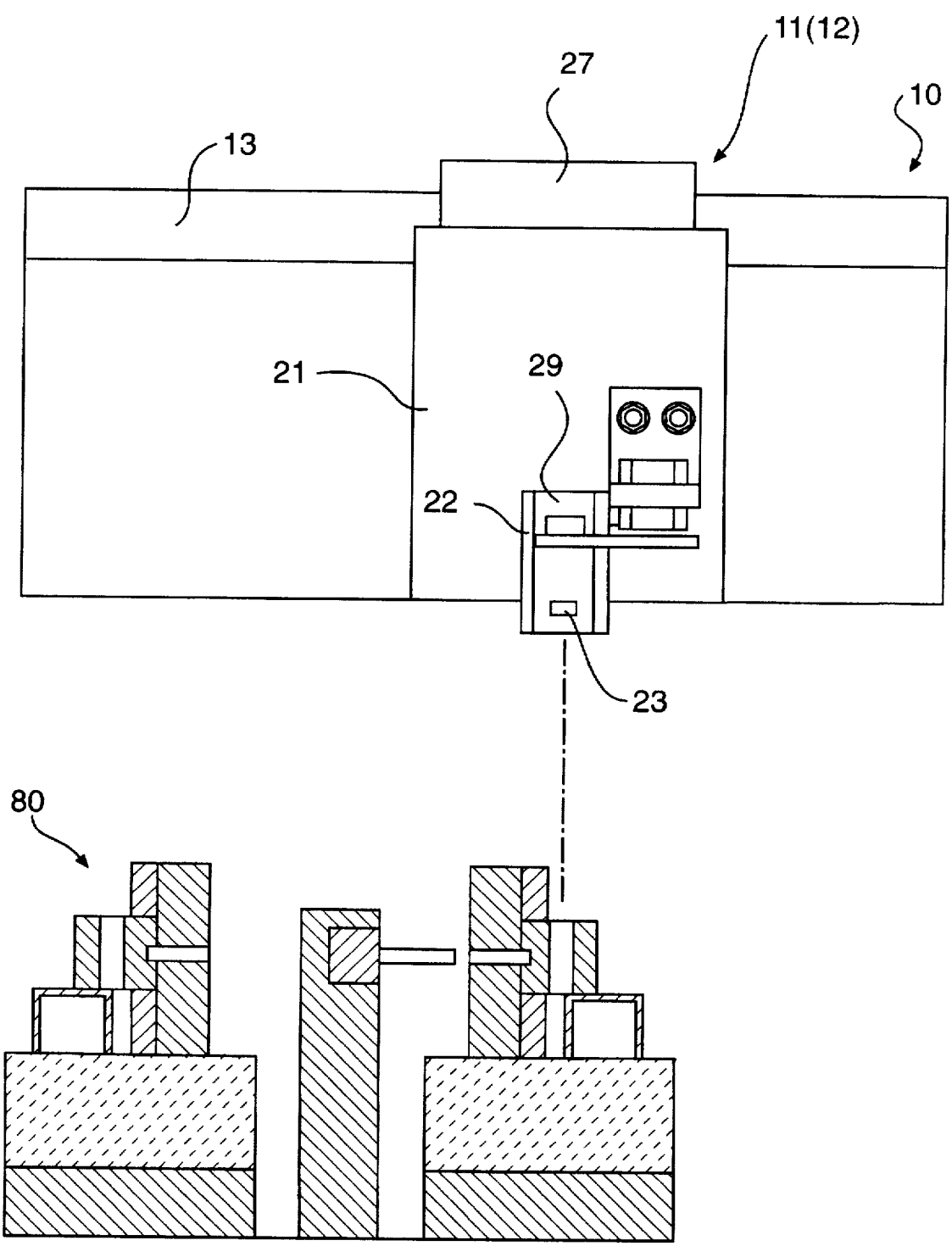
FIG. 10 is a front view of a portion of the die bonding device installed by the collet exchanger, according to the present invention.

FIG. 10 shows the die bonding device of the present invention which adopts the collet exchanger, as described with reference to FIG. 2. The collet 24 is exchangeably mounted on one side at the front of the bonding heads 11 (12), and in the case that the collet exchanger 80 of FIG. 8 is used, an arm (not shown) and a chuck 23 attached thereto are installed in one side at the front of the bonding head 11 (12). The chuck 23 is raised and lowered vertically by the voice coil motor 29 supported to a holder 22. The cylinder 71 of FIG. 6 is installed in the chuck 23. The collet exchanger 80 of FIGS. 8 and 9 is installed at one side of the lower portion of the frame 13. In the die bonding device, the bonding heads 11 and 12 move horizontally to the upper portion of the collet exchanger 80 according to the drive of the linear step motor, and the chuck 23 of the bonding head 11 (12) is raised and lowered vertically according to drive of the voice coil motor 29, and at the same time the collets can be exchanged by operating the collet exchanger 80. Preferably, the collet exchanger 80 can be located at any place in the lower portion of the frame 13, where and each bonding head 11 and 12 can reach it. For example, as shown in FIG. 1, the collet exchanger 80 can be arranged close to the pre-alignment system 19.

In the die bonding device according to the present invention, direct bonding or indirect bonding can be performed while two bonding heads are moved horizontally by a motor, and the collets installed in each bonding head may move vertically by a voice coil motor. According to the present invention, it is not necessary to select a particular device depending on the type of semiconductor device and characteristics of a product line, as in the conventional technology. Thus, production can increase and product cost can be reduced. The present invention relates to a device for bonding the semiconductor chips to the lead frame. However, the characteristic construction of the present invention can also be used for a chip transferring device for loading chips of a wafer on a tray, a COB bonding device for bonding chips of a wafer or a tray to a printed circuit board, or a device for bonding chips of a tape feeder or a tray or package to a printed circuit board. Also, using the collet exchanger of the die bonding device, it is possible to precisely and rapidly exchange the collet depending on the change of chip size without manual operation, to thereby efficiently perform die bonding.

It should be understood that additional advantages and modifications will readily occur to those skilled in the art. The invention in it's broader aspects is, therefore, not limited to the specific details, representative apparatus and illustrative examples shown and described. Accordingly, departures may be made from such details without departing from the spirit or scope of the general inventive concept as defined by the appended claims and the equivalents.

What is claimed is:

1. A die bonding device comprising:
 a frame member;
 a first bonding head having controlled horizontal linear movement along said frame member;
 wafer supporting means for supporting a wafer from which semiconductor chips are formed;
 first semiconductor chip suction means installed in said first bonding head for picking up semiconductor chips from said wafer by vacuum suction;
 lead frame transferring means for transferring a lead frame to a semiconductor chip bonding position;
 a second bonding head having controlled horizontal linear movement along said frame member;
 a pre-alignment system for aligning a semiconductor chip from said first semiconductor chip suction means; and
 second semiconductor chip suction means installed in said second bonding head for picking up semiconductor chips aligned according to said pre-alignment system.

2. A die bonding device according to claim 1, wherein said first and second semiconductor chip suction means are first and second collets exchangeably mounted on said first and second bonding heads, respectively, and said collets are raised and lowered by a voice coil motor.

3. A die bonding device according to claim 1, wherein said first and second bonding heads are driven by a linear step motor during horizontal movement.

4. A die bonding device according to claim 1, wherein each position of said first and second bonding heads is detected during horizontal movement by linear encoders installed in each bonding head and a linear scale installed in said frame member.

5. A die bonding device according to claim 2, wherein the position of each of said collets is detected by sensing plates and a proximitor.

6. A die bonding device according to claim 1, wherein said first bonding head controllably reciprocates between said wafer supporting means and said lead frame transferring means, such that said first semiconductor chip suction means detaches semiconductor chips from the wafer supported by said wafer supporting means and performs bonding of the semiconductor chip to the lead frame supported by said lead frame transferring means.

7. A die bonding device according to claim 1, wherein said first bonding head controllably reciprocates between said wafer supporting means and said pre-alignment system, such that said first collet detaches semiconductor chips from the wafer supported by said wafer supporting means and aligns the chips in said pre-alignment system, and said second bonding head controllably reciprocates between said pre-alignment system and said lead frame transferring means, such that said second collet performs bonding of the semiconductor chips aligned in said pre-alignment system to said lead frame supported by said lead frame transferring means.

8. A die bonding device according to claim 1, wherein said first and second semiconductor chip suction means each comprise:

- a first chuck having a dovetail-shaped groove and a hole;
- a first cylinder having a rod capable of controllably reciprocating in said dovetail-shaped groove through the hole of said first chuck; and
- a collet having a first dovetail-shaped protrusion corresponding to the groove of said first chuck on one side thereof and a second dovetail-shaped protrusion on another side thereof.

9. A die bonding device according to claim 8, further comprising a collet exchanger for exchanging said collet, wherein said collet exchanger comprises:

- a plurality of second chucks wherein both a dovetail groove corresponding to the second protrusion of said collet and a hole are formed in each second chuck; and
- a second cylinder having a rod controllably reciprocating through said hole of said second chuck.

10. A die bonding device according to claim 9, wherein said second chucks are arranged so as to be spaced radially at predetermined intervals on said collet exchanger, and wherein said device further comprises means for controllably rotating said second chucks such that the rod of said second cylinder can reciprocate through said hole of one of said second chucks.

11. A die bonding device according to claim 9, further comprising an elastic member installed in one end of each of said second chucks in order to support collets received in said second chucks.

\* \* \* \* \*